United States Patent
Wensley et al.

(10) Patent No.: US 6,849,495 B2
(45) Date of Patent: Feb. 1, 2005

(54) SELECTIVE SILICIDATION SCHEME FOR MEMORY DEVICES

(75) Inventors: Paul Wensley, Leics (GB); Mohammed Fazil Fayaz, Pleasantville, NY (US); Martin Commons, Glen Allen, VA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/376,461

(22) Filed: Feb. 28, 2003

(65) Prior Publication Data

US 2004/0171213 A1 Sep. 2, 2004

(51) Int. Cl.[7] ................ H01L 21/8242; H01L 21/44
(52) U.S. Cl. ................ 438/243; 438/244; 438/250; 438/253; 438/386; 438/393; 438/396; 438/682; 438/664; 438/683
(58) Field of Search .................. 438/243–256, 438/386–399, 630, 664, 649, 655, 682–683, 755

(56) References Cited

U.S. PATENT DOCUMENTS

| | | | | |
|---|---|---|---|---|
| 4,873,205 A | * | 10/1989 | Critchlow et al. | 438/647 |
| 4,983,544 A | * | 1/1991 | Lu et al. | 438/698 |
| 5,059,549 A | * | 10/1991 | Furuhata | 438/234 |
| 5,200,354 A | * | 4/1993 | Om et al. | 438/243 |
| 5,545,581 A | * | 8/1996 | Armacost et al. | 438/631 |
| 6,008,104 A | * | 12/1999 | Schrems | 438/386 |
| 6,037,107 A | * | 3/2000 | Thackeray et al. | 430/326 |
| 6,258,659 B1 | * | 7/2001 | Gruening et al. | 438/243 |
| 6,281,067 B1 | * | 8/2001 | Chien et al. | 438/241 |
| 6,303,451 B1 | * | 10/2001 | Zhang et al. | 438/301 |
| 6,426,247 B1 | * | 7/2002 | Divakaruni et al. | 438/185 |
| 6,440,791 B1 | * | 8/2002 | Gau | 438/239 |
| 6,482,699 B1 | * | 11/2002 | Hu et al. | 438/258 |

* cited by examiner

*Primary Examiner*—John F. Niebling
*Assistant Examiner*—Jennifer M. Kennedy
(74) *Attorney, Agent, or Firm*—Slater & Matsil, L.L.P.

(57) ABSTRACT

A memory device and method of manufacturing thereof, wherein a silicide material is selectively formed over active regions of a memory device. A silicide material may also be formed on the top surface of wordlines adjacent the active regions during the selective silicidation process. A single nitride insulating layer is used, and portions of the workpiece are covered with photoresist during the formation of the silicide material.

17 Claims, 4 Drawing Sheets

SELECTIVE SILICIDATION SCHEME FOR MEMORY DEVICES

TECHNICAL FIELD

Embodiments of the present invention relate generally to semiconductor devices, and more particularly to the formation of silicides in semiconductor processing.

BACKGROUND

Semiconductor devices are used in a variety of electronic applications, such as personal computers and cellular phones, for example. The semiconductor industry in general is being driven to decrease the size of semiconductor devices located on integrated circuits. Miniaturization is generally needed to accommodate the increasing density of circuits necessary for today's semiconductor products.

One semiconductor product widely used in electronic systems for storing data is a semiconductor memory device, and one common type of semiconductor memory device is a dynamic random access memory (DRAM). A DRAM typically includes millions or billions of individual DRAM cells arranged in an array, with each cell storing one bit of data. A DRAM memory cell typically includes an access field effect transistor (FET) and a storage capacitor. The access FET allows the transfer of data charges to and from the storage capacitor during reading and writing operations. In addition, the data charges on the storage capacitor are periodically refreshed during a refresh operation.

DRAM storage capacitors are often formed by etching deep trenches in a substrate. A plurality of layers of conductive and insulating materials are deposited in order to produce a storage capacitor that is adapted to store a bit of data, represented by a one or zero. Prior art DRAM designs typically comprise an access FET disposed in a subsequent layer to the side of the storage capacitor. Some DRAM designs involve disposing the access FET directly above the storage capacitor in the upper part of the trench, which conserves surface area, resulting in the ability to place more DRAM cells on a single chip.

A recent DRAM design comprises an embedded DRAM, wherein logic circuitry and memory cells are fabricated on a single chip. This introduces manufacturing challenges, often requiring that the conductive lines for the memory cells comprise silicon rather than metal, for example. Because silicon has a lower conductivity than metals, often, means for improving the conductivity of silicon are utilized, to improve device performance and increase speed.

SUMMARY OF THE INVENTION

A preferred embodiment of the present invention includes a method of manufacturing a semiconductor device. The method includes providing a workpiece, the workpiece comprising a semiconductor material, forming at least one memory cell within the workpiece, and forming first conductive lines proximate the at least one memory cell, wherein the first conductive lines provide access to the at least one memory cell. A first insulating layer is deposited over the at least one memory cell and first conductive lines, a second insulating layer is deposited over the first insulating layer, and a photoresist is deposited over the second insulating layer. A portion of the photoresist is removed, and the second insulating layer and first insulating layer are etched, exposing at least an active region of the memory cell. A silicide material is formed on the exposed active region and first conductive line top surface.

In accordance with another preferred embodiment of the present invention, a method of manufacturing a memory device includes providing a workpiece, the workpiece comprising a semiconductor material, and forming at least one memory cell within the workpiece. At least one first conductive line is formed proximate the at least one memory cell, wherein the first conductive line provides access to the at least one memory cell. A first insulating layer is deposited over the at least one memory cell and first conductive lines, and a second insulating layer is deposited over the first insulating layer. A photoresist is deposited over the second insulating layer, a portion of the photoresist is removed, and the second insulating layer and first insulating layer are etched, exposing at least a top surface of the first conductive lines, leaving a portion of the first insulating layer on the sidewalls of the first conductive lines. A silicide material is formed on the first conductive line top surface, and an insulative material is deposited over at least the silicide material. The method includes opening the insulative material over the silicided active region, filling the opening over the silicided active region with a conductive material, and forming at least one second conductive line over the conductive material.

In accordance with yet another preferred embodiment of the present invention, a semiconductor device includes a workpiece, the workpiece comprising a semiconductor material, the workpiece including at least one memory cell formed therein, the memory cell including an active region. The semiconductor device includes at least one first conductive line proximate the at least one memory cell, wherein the first conductive line provides access to the at least one memory cell, the first conductive line having a top surface and sidewalls. A first insulating layer is formed over the at least one memory cell and at least one first conductive line, and a spacer is formed over at least one sidewall of the at least one first conductive line. A silicide material is formed over the active region of the memory cell.

Advantages of preferred embodiments of the present invention include providing a method of forming silicide material over an active region and/or first conductive line, improving the contact resistance of the active region and/or first conductive line. Embodiments of the invention improve the thermal budget due to the use of a single nitride layer. The process has few processing steps, reducing the raw process time (RPT). Fewer processing steps results in decreased chances for the introduction of defects, resulting in higher yields.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A description of preferred embodiments of the present invention will be discussed, followed by a discussion of some advantages of embodiments of the invention. A cross-section of active regions of one memory cell is shown in each figure, although many other memory cells and components of memory cells may be present in the semiconductor devices shown. The present invention will be described with respect to preferred embodiments in a specific context, namely a dynamic random access memory (DRAM). The invention may also be applied, however, to other memory devices and semiconductor devices, for example.

Figure 1:
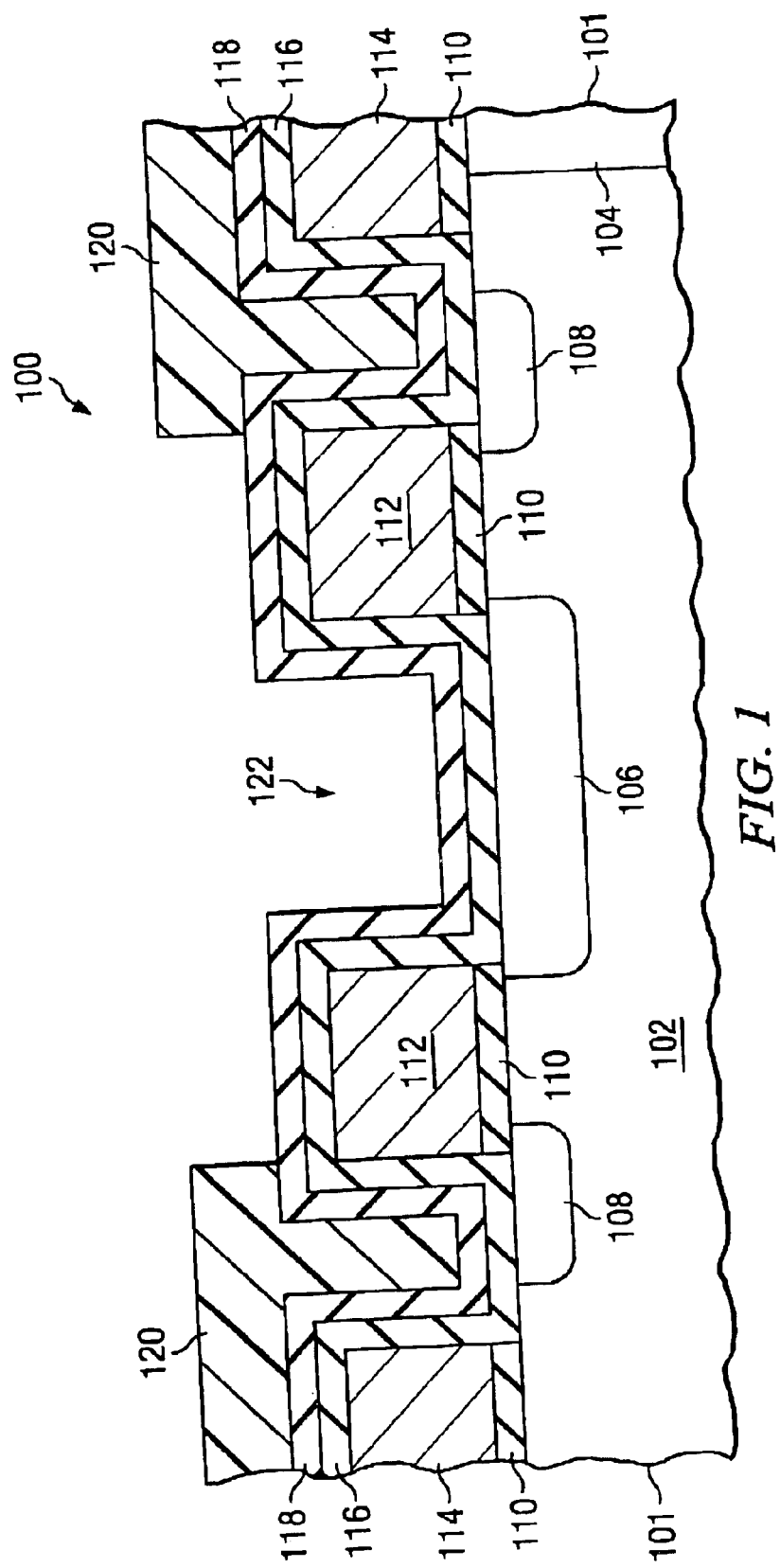
FIGS. 1 through 4 illustrate cross-sectional views of an embodiment of the invention at various stages of fabrication.

With reference now to FIG. 1, a cross-sectional view of a semiconductor device 100 in accordance with an embodiment of the invention is illustrated. A workpiece 101 is provided. The workpiece 101 preferably comprises a semiconductor wafer or substrate that is doped, for example, with a first dopant to form an N well 102 and with a second dopant to form a P well 104, as examples. Boron is usually used to form P type material, and arsenic or phosphine are typically used to form N type material, as examples. The workpiece 101 typically comprises a semiconductor material such as single-crystal silicon, and may include other conductive layers or other semiconductor elements such as transistors or diodes, as examples. The workpiece 101 may alternatively comprise compound semiconductors such as GaAs, InP, Si/Ge, SiC, as examples.

Figure 5:
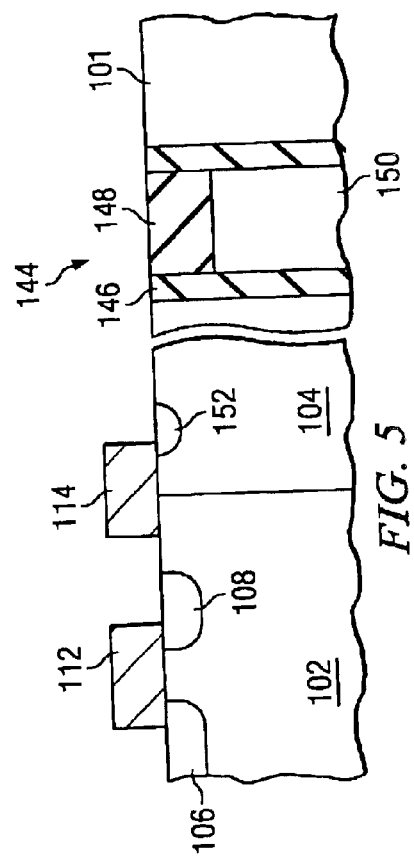
FIG. 5 shows a cross-sectional view of an embodiment of the invention, showing a deep trench capacitor.

At least one memory cell is formed within the workpiece 101. The memory cell includes a deep trench capacitor 144 (not shown in FIG. 1; see FIG. 5) and active regions 108 and 106 that are used to access the deep trench capacitor 144. A pad nitride 12 may be deposited over the semiconductor substrate 101, not shown. The memory cell deep trench capacitor 144 comprises a trench that may have a high aspect ratio, e.g., the depth may be much greater than the width. For example, only the top part of the deep trench capacitor 144 is shown in FIG. 5. The trench may be 100 nm wide and 10 μm deep below the top surface of the substrate 101, as examples, although the trench may be larger or smaller, depending on the application. The deep trench capacitor 144 may have an oval shape when viewed from the top surface of the workpiece 101, and alternatively, the deep trench capacitor 144 may comprise other shapes, such as square, rectangular, or circular, as examples. The deep trench capacitor 144 may form a storage node or capacitor of the memory cell, for example.

A collar oxide 146 is formed within the deep trench. The trench collar oxide 146 serves to isolate memory cells and other devices (not shown) on the workpiece 101 from one another. A semiconductor material 150 such as polysilicon is deposited within the trenches over the collar oxide 146. The semiconductor material 150 is recessed or etched back from the top of the wafer 10 using a dry etch, as an example, to a predetermined depth within the trenches below the top of the substrate 101 to a depth of, for example, 300–400 nm. Recessing the first semiconductor material 150 trench fill defines the channel length of the access transistor. A top trench oxide (TTO) 148 is then formed over the semiconductor material 150.

Referring again to FIG. 1, the memory cell includes active regions 106 and 108 formed within the workpiece 101. For example, active region 106 may comprise an N– region, and regions 108 may comprise P+ regions. A gate oxide 110 is formed over the workpiece 101. The gate oxide 110 may comprise silicon dioxide or other insulating materials, for example. A conductive material 112/114, preferably comprising polysilicon, and alternatively comprising other semiconductor materials or a metal, is deposited over the gate oxide 110. The conductive material 112/114 and the gate oxide 110 are patterned and etched to form first conductive lines 112 and second conductive lines 114. The first conductive line 112 preferably comprise active wordlines, and second conductive lines 114 preferably comprise passing wordlines of the memory device, for example. The first and second conductive lines 112 and 114 may run parallel to one another in a direction in and out of the page, for example. An alternating signal may be placed on the active wordline 112, and a supply voltage such as 33 V or other voltage may be applied to the passing wordline 114, for example. The first and second conductive lines 112 and 114 preferably are adapted to function as gates, for example. First conductive line 112 functions as a gate and active regions 106 and 108 function as the source and drain, for example. Similarly, second conductive line 114 is a gate, and active regions 152 (see FIG. 5) and 108 function as a source and drain. First and second conductive lines 112 and 114 may have a width of 114 to 240 nm or less and have a height of about 2000 Angstroms or less, as examples, although the first and second conductive lines 112 and 114 may comprise other dimensions.

In accordance with embodiments of the invention, after the wordlines 112 and 114 are formed, a first insulating layer 116 is deposited over the workpiece 101, to cover the conductive lines 112/114 and exposed portions of the workpiece 101. The insulating layer 116 preferably comprises a doped oxide such as boro-phosphosilicate glass (BPSG), although other insulating materials may alternatively be used. A second insulating layer 118 is deposited over the first insulating layer 116. The second insulating layer 118 preferably comprises a nitride, such as silicon nitride, although alternatively, other insulating materials may be used.

A photoresist 120 is deposited over the second insulating layer, as shown in FIG. 1. The photoresist 120 is patterned and etched to remove the photoresist 120 from the regions 122 to be silicided. The photoresist 120 is left remaining over the remainder of the workpiece 101, in particular, over the regions between the first and second conductive lines 112 and 114. It is desirable that no conductive material be deposited between the first and second conductive lines 112 and 114, because that could create shorts and cause device failures.

Figure 2:
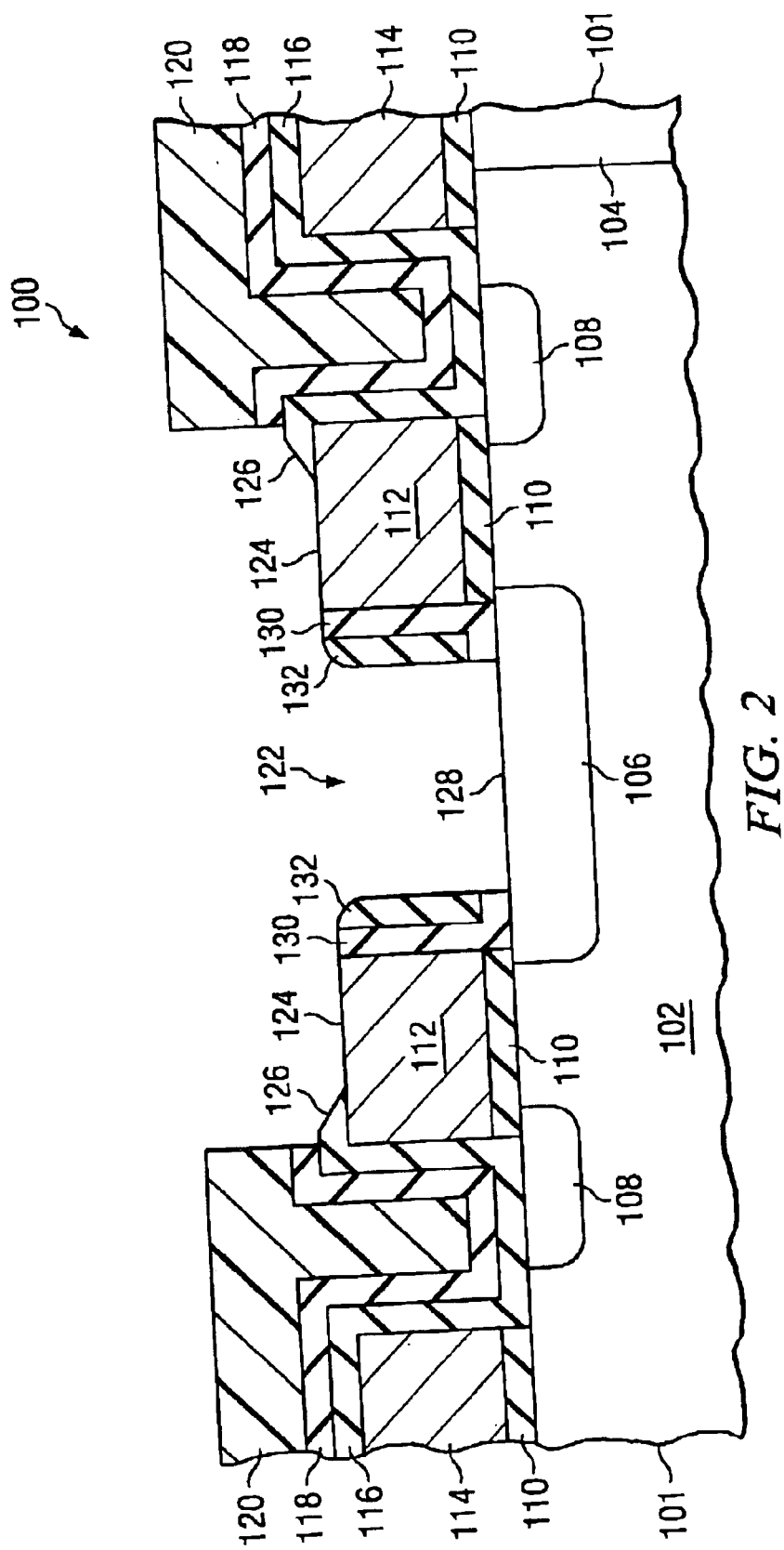

With the photoresist 120 left remaining on the workpiece 101, an etch is performed to remove the first and second insulating layer 116 and 118 from the top surface of the first conductive lines 112 and from the top surface of the active region 106, as shown in FIG. 2. The etch preferably comprises a two-process etch, using a first predominantly anisotropic etch adapted to remove the second insulating material 118 from the top surfaces while leaving the second insulating material 118 on the sidewalls, e.g. at 132, of the first conductive lines 112. The second etch process is preferably a predominantly isotropic etch selective to nitride 132 and 126, adapted to remove the first insulating material 116 from the top surfaces 124 and 128 of the first conductive lines 112 and active region 106, respectively. During the second etch process, the nitride layer 132 protects the underlying doped oxide 130, so that a spacer comprised of first insulating layer 130 and second insulating layer 132 is left remaining on the sidewalls of the first conductive lines 112. Note that due to the nature of the etch process, a relatively small portion 126 of the first insulating layer 116 may remain over a portion of the top edge of the first conductive lines 112. This portion may have a tapered edge, and the nitride region 132 that remains on the sidewall of the first conductive lines 112 may have a downwardly-sloping top region, as shown.

Figure 3:
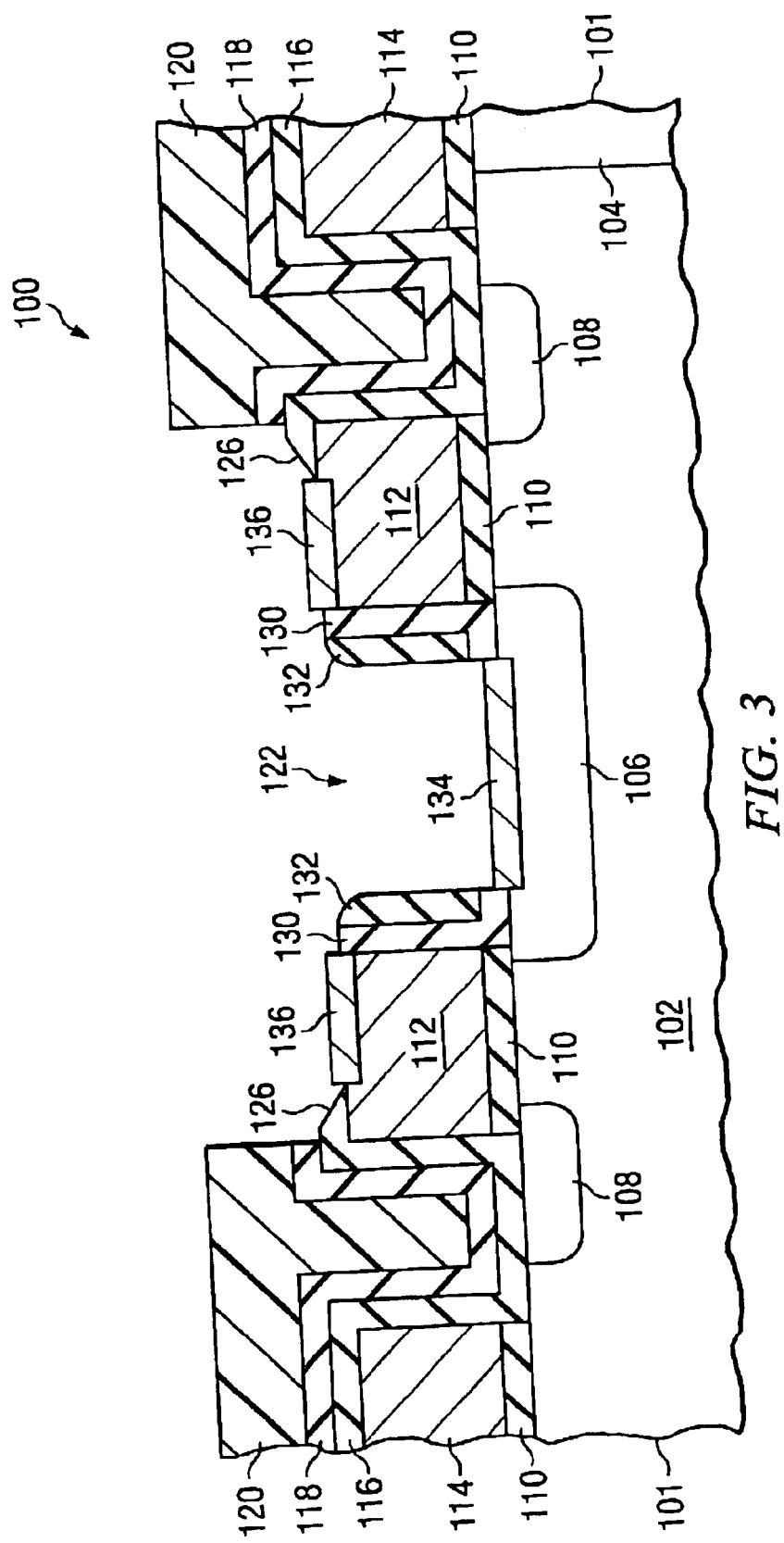

Referring next to FIG. 3, again with the photoresist 120 left remaining over the workpiece 101, the wafer is exposed to an element such as cobalt to form a silicide material over exposed semiconductor material. Preferably, in one embodiment, the active region 106 is exposed and a silicide material 134 is formed over the active region 106. In another embodiment, a portion of the top surface of at least one of the first conductive lines 112 is exposed to cobalt to form a silicide material 136 over the first conductive lines 112. In yet another embodiment, a silicide material 134 and 136 are formed over the active region 106 and the first conductive lines 112 simultaneously.

The silicide material 134 and 136 is preferably formed by exposing the workpiece 101 to a gas containing an element such as cobalt. The cobalt reacts with the top surface of the silicon or semiconductor material, forming the silicide at the top surface. Alternatively, the silicide material 134 and 136 may be formed by chemical vapor deposition (CVD), physical vapor deposition, (PVD), or by another deposition means, as examples. The silicide material 134 and 136 preferably comprise active CoSi, although the silicide material 134 and 136 may alternatively comprise other silicides, for example. Preferably, the silicide material 134 and 136 comprise a material having a high conductivity. Preferably, the deposition method used is selective such that no silicide is formed over the nitride layer 126 or 132, or over the first insulating layer 130.

Figure 4:
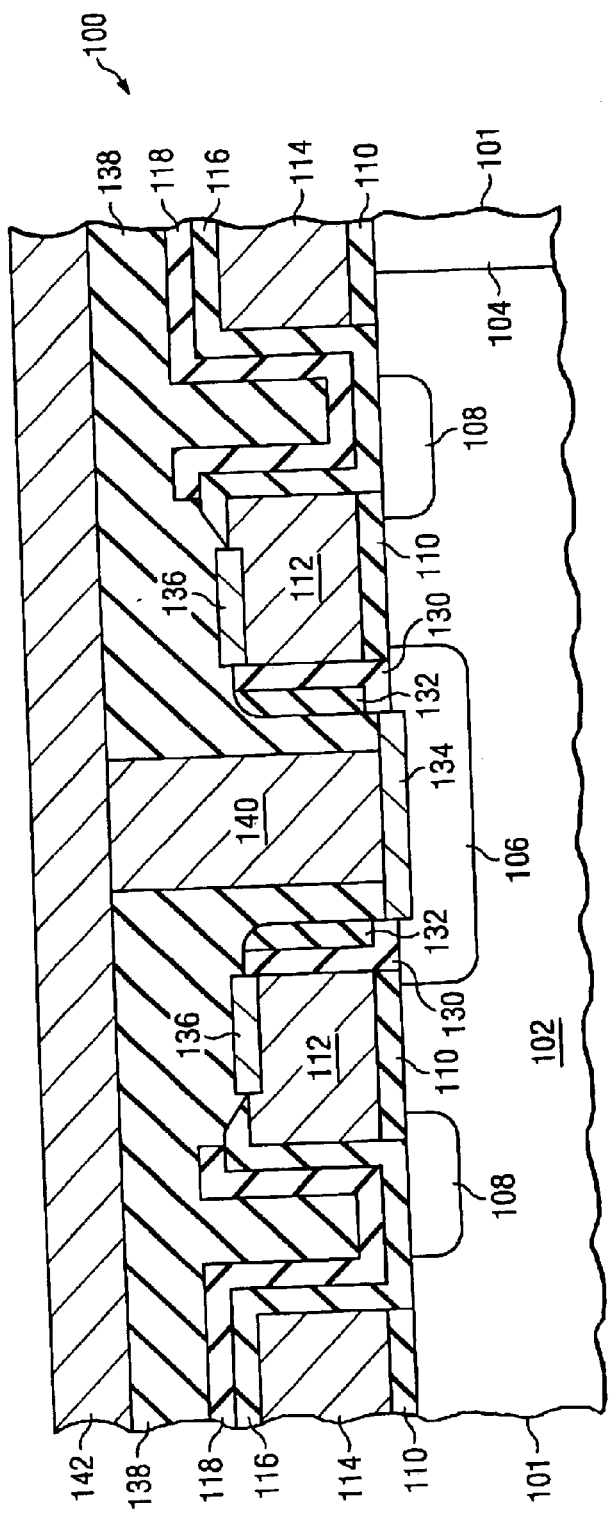

Referring now to FIG. 4, next, the photoresist 120 is removed, and a third insulating layer 138 is deposited over the workpiece 101. The third insulating layer 138 preferably comprises BPSG, although other insulating materials such as tetraethylorthosilane (TEOS), as an example, may be used. Preferably, the third insulating layer 138 is deposited to a thickness to cover the topography of the wafer and form a conformal, smooth top surface finish, as shown.

Next, the third insulating layer 138 is patterned and etched to form a pattern for a plug 140. A conductive material 140 such as tungsten or other metals or semiconductors, as examples, is deposited over the third insulating layer 138. The conductive material 140 abuts the silicide layer 134 formed on top of the active region 106. Third conductive lines 142 that preferably run substantially perpendicular or in a different direction from first and second conductive lines 112 and 114 may be formed over the third insulating layer 138. The plug 140 of conductive material functions as a via to connect the third conductive line 142 to the silicide material 134 of the underlying active region 106. The third conductive line 142 may comprise a bitline of the memory device, for example, and may comprise copper, or other conductors or semiconductors, for example. The third conductive line 142 may also include a liner such as titanium nitride (not shown), deposited prior to the deposition of the conductive material. The silicide layer 134 improves the resistance of the electrical connection, providing faster speed and improved performance for the device. Subsequent layers of insulating, conducting and/or semiconductor materials may then subsequently be deposited on the wafer and/or patterned, to complete the fabrication of the semiconductor device.

The first, second and third conductive lines 112, 114 and 142 preferably comprise the wordlines and bitlines of the memory device, and are coupled to active components or logic devices elsewhere on the semiconductor device (not all connections are shown in the Figures.) The wordlines and bitlines 112, 114 and 142 are used to access the memory cell in order to read and/or write data, stored as a charge, from or into the storage capacitor 144, as shown in FIG. 5. More particularly, the active wordline 112 may be used to connect the gate of the transistor to the memory cell (of FIG. 5). Thus, the silicide material 136 formed over the first wordlines 112 reduces the resistance of the connection to other components or logic devices (this connection is not shown; it is made elsewhere on the semiconductor device, for example, in a plane parallel to the page, along the length of the wordline 112). The reduction in resistance improves device performance so that the memory device may operate faster. In FIG. 5, only one deep trench capacitor 144 is shown; there may also be another deep trench capacitor on the left-hand side of the drawing on the other side of the first wordline 112, in a mirror image.

Advantages of embodiments of the present invention include providing a method of forming a silicide material over an active region and/or first conductive line. The silicide material reduces the contact resistance of the connections to other components or logic devices, such as the plug 140, resulting in improved speed and increased device performance. The process has few processing steps, reducing the raw process time (RPT). Fewer processing steps results in a decreased chance for the introduction of defects, resulting in higher yields.

Embodiments of the present invention also reduce the thermal budget required, due to the use of a single nitride layer. In the fabrication of some prior art memory devices, several nitride layers are deposited to achieve conformality of the insulating layer between the active wordline 112 and the passing wordline 114. Each time a nitride layer is deposited, thermal stress is introduced to a semiconductor wafer. Thermal cycling can cause dopants of active regions to move, which introduces variability into the manufacturing process. Embodiments of the present invention reduce the thermal budget required, because only one nitride layer 118 is required.

Yet another advantage is that no parasitic spacers are formed between the active and passing wordlines 112 and 114. Thus, no spacer etch is required between the active and passing wordlines 112 and 114, because the nitride layer 118 remains on the finished device. This is advantageous because fewer processing steps are required, reducing raw processing time and reducing costs. Also, parasitic spacer etches of the prior art have shown to be associated with the formation of defects, which can be detrimental to retention of the data of a memory cell. Thus, embodiments of the invention result in an improved memory device.

Another advantage is that for the photoresist 120 patterning and etch, deep-ultraviolet (DUV) lithography may be used, which uses a wavelength of about 248 nm, so that better alignment can be achieved. DUV is a better performing lithography than I-Line Lithography, which uses a wavelength of 365 nm.

Embodiments of the present invention are particularly useful in embedded DRAM devices, e.g., where memory cells are manufactured on the same chip as logic circuits. However, embodiments of the present invention have useful application in other memory devices and semiconductor devices. Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that the materials and processing steps described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, comprising:
   providing a workpiece, the workpiece comprising a semiconductor material;
   forming at least one memory cell within the workpiece;
   forming at least one first conductive line proximate the at least one memory cell, wherein the first conductive line provides access to the at least one memory cell;
   depositing a first insulating layer over the at least one memory cell and first conductive line;
   depositing a second insulating layer over the first insulating layer;
   depositing a photoresist over the second insulating layer;
   removing a portion of the photoresist;
   etching the second insulating layer and first insulating layer, exposing at least an active region of the memory cell, wherein etching the second insulating layer and first insulating layer comprises a two-step etch process, wherein one of the steps comprises an anisotropic etch and the other step comprises an isotropic etch; and
   forming a silicide material on the exposed active region top surface.

2. The method according to claim 1, wherein etching the second insulating layer and first insulating layer further comprises exposing a top surface of the first conductive line, and wherein forming a silicide material further comprises forming a silicide material on the first conductive line top surface.

3. The method according to claim 1, wherein the first insulating layer comprises boro-phosphosilicate glass (BPSG), wherein the second insulating layer comprises silicon nitride.

4. The method according to claim 1, wherein etching the second insulating layer and first insulating layer comprises leaving a portion of the first insulating layer on the sidewalls of the at least one first conductive line.

5. The method according to claim 1, wherein forming a silicide material comprises exposing the workpiece to cobalt.

6. The method according to claim 1, wherein depositing a photoresist and removing a portion of the photoresist comprises a deep-ultraviolet (DUV) process.

7. The method according to claim 1, wherein the anisotropic etch is performed before the isotropic etch.

8. The method according to claim 1, further comprising:
   depositing an insulative material over at least the silicide material;
   opening the insulative material over the silicided active region;
   filling the opening over the silicided active region with a conductive material; and
   forming at least one second conductive line over the conductive material.

9. The method according to claim 1, wherein the memory cell comprises a dynamic random access memory (DRAM) device.

10. A method of manufacturing a memory device, comprising:
    providing a workpiece, the workpiece comprising a semiconductor material;
    forming at least one memory cell within the workpiece, the at least one memory cell comprising an active region;
    forming at least one first conductive line proximate the at least one memory cell, wherein the at least one first conductive line provides access to the at least one memory cell;
    depositing a first insulating layer over the at least one memory cell and the at least one first conductive line;
    depositing a second insulating layer over the first insulating layer;
    depositing a photoresist over the second insulating layer;
    removing a portion of the photoresist;
    etching the second insulating layer and first insulating layer, exposing at least a top surface of the at least one first conductive line, leaving a portion of the first insulating layer on the sidewalls of the at least one first conductive line, wherein etching the second insulating layer and first insulating layer comprises a two-step process, wherein one of the steps comprises an anisotropic etch and the other step comprises an isotropic etch;
    forming a silicide material on at least the first conductive line top surface;
    depositing an insulative material over at least the silicide material;
    opening the insulative material over the active region;
    filling the opening over the active region with a conductive material; and
    forming at least one second conductive line over the conductive material.

11. The method according to claim 10, wherein etching the second insulating layer and first insulating layer further comprises exposing the active region of the memory cell, wherein forming a silicide material further comprises forming a silicide material on the exposed active region, wherein the conductive material abuts the silicide material on the active region.

12. The method according to claim 10, wherein the first insulating layer and insulative material comprise borophosphosilicate glass (BPSG), wherein the second insulating layer comprises silicon nitride.

13. The method according to claim 10, wherein forming a silicide material comprises exposing the workpiece to cobalt.

14. The method according to claim 10, wherein depositing a photoresist and removing a portion of the photoresist comprises a deep-ultraviolet (DUV) process.

15. The method according to claim 10, wherein the anisotropic etch is performed before the isotropic etch.

16. The method according to claim 10, further comprising forming at least one third conductive line proximate the at least one memory cell; wherein the photoresist protects the area between the first conductive line and third conductive line while forming the silicide material.

17. The method according to claim 16, wherein the at least one first conductive line comprises an active wordline, at least one second conductive line comprises a bitline, and the at least one third conductive line comprises a passing wordline, wherein the at least one memory cell comprises a dynamic random access memory (DRAM) device.

* * * * *

UNITED STATES PATENT AND TRADEMARK OFFICE
CERTIFICATE OF CORRECTION

PATENT NO. : 6,849,495 B2
DATED : February 1, 2005
INVENTOR(S) : Wensley et al.

It is certified that error appears in the above-identified patent and that said Letters Patent is hereby corrected as shown below:

Column 4,
Line 32, delete "33 V" and insert -- 3.3 V --.

Signed and Sealed this

Seventh Day of June, 2005

JON W. DUDAS
*Director of the United States Patent and Trademark Office*